United States Patent
Gamboa et al.

(10) Patent No.: US 8,106,489 B1
(45) Date of Patent: Jan. 31, 2012

(54) INTEGRATED CIRCUIT PACKAGE AND PACKAGING METHOD

(75) Inventors: Carlo Gamboa, Milpitas, CA (US); Salvador Padre, Cavite (PH)

(73) Assignee: Cypress Semiconductor Corporation, San Jose, CA (US)

( * ) Notice: Subject to any disclaimer, the term of this patent is extended or adjusted under 35 U.S.C. 154(b) by 444 days.

(21) Appl. No.: 12/154,775

(22) Filed: May 27, 2008

Related U.S. Application Data

(60) Provisional application No. 60/931,889, filed on May 25, 2007.

(51) Int. Cl.
    *H01L 23/48* (2006.01)
(52) U.S. Cl. ......... 257/666; 438/612; 438/108; 257/693
(58) Field of Classification Search ............... 257/693, 257/666
    See application file for complete search history.

(56) References Cited

U.S. PATENT DOCUMENTS

| | | | |
|---|---|---|---|
| 6,316,821 B1 | 11/2001 | Chang et al. | |
| 6,331,728 B1 | 12/2001 | Chang et al. | |
| 6,576,491 B1 | 6/2003 | Chang et al. | |
| 6,649,447 B1 | 11/2003 | Chang et al. | |
| 7,285,847 B2 * | 10/2007 | Lee | 257/686 |
| 7,531,383 B2 * | 5/2009 | Lo et al. | 438/109 |
| 7,592,691 B2 * | 9/2009 | Corisis et al. | 257/686 |
| 7,608,916 B2 * | 10/2009 | Abbott | 257/677 |
| 2004/0155361 A1 * | 8/2004 | Minamio et al. | 257/787 |
| 2005/0167855 A1 * | 8/2005 | Minamio et al. | 257/787 |
| 2006/0276157 A1 * | 12/2006 | Chen et al. | 455/333 |
| 2007/0001296 A1 * | 1/2007 | Lee et al. | 257/723 |

* cited by examiner

*Primary Examiner* — Benjamin Sandvik
*Assistant Examiner* — Krista Soderholm

(57) ABSTRACT

A package and packaging method are provided that enable packaging of larger dies and/or smaller packages. Generally, the method includes steps of: (i) reducing a thickness of a portion of a top surface of leads of a leadframe extending into a package being formed; (ii) mounting a die to a paddle of the leadframe, the die extending past an edge of the paddle into a space created by reducing the thickness of the leads; and (iii) encapsulating the die and leadframe, including the reduced portion of the leads, in a molding compound. In one embodiment, the leads are reduced by half-etching the portion of the top surface. Preferably, the method further includes wire bonding pads on the die to etched portions of the leads to electrically couple the die to the leads. Alternatively, wire bonding is between the pads and non-etched portions of the leads. Other embodiments are also disclosed.

14 Claims, 3 Drawing Sheets

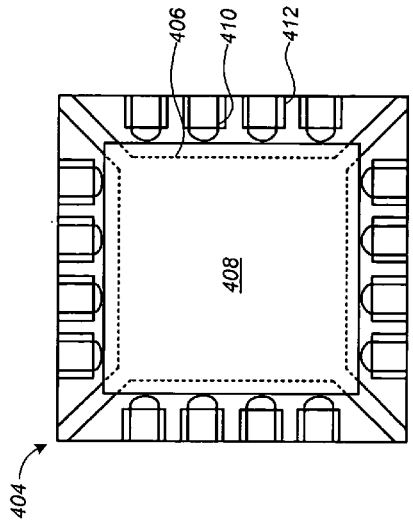
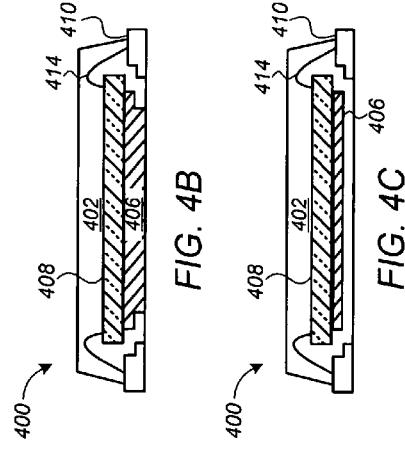
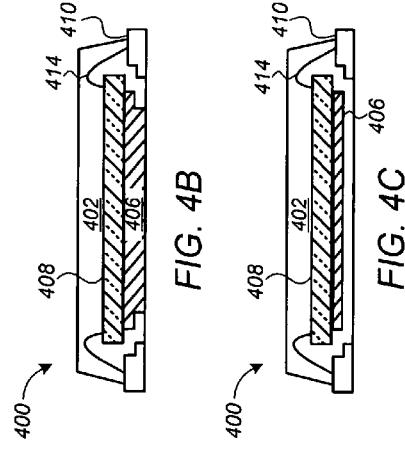
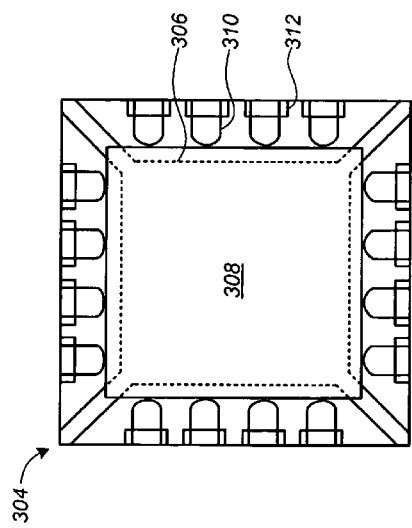
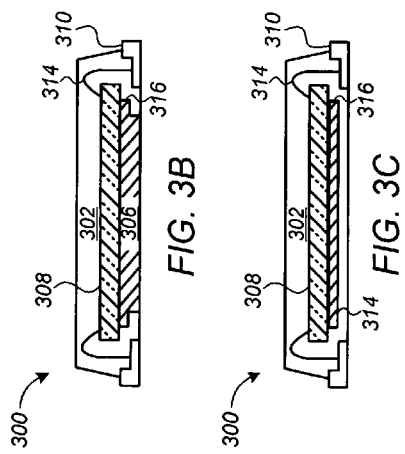

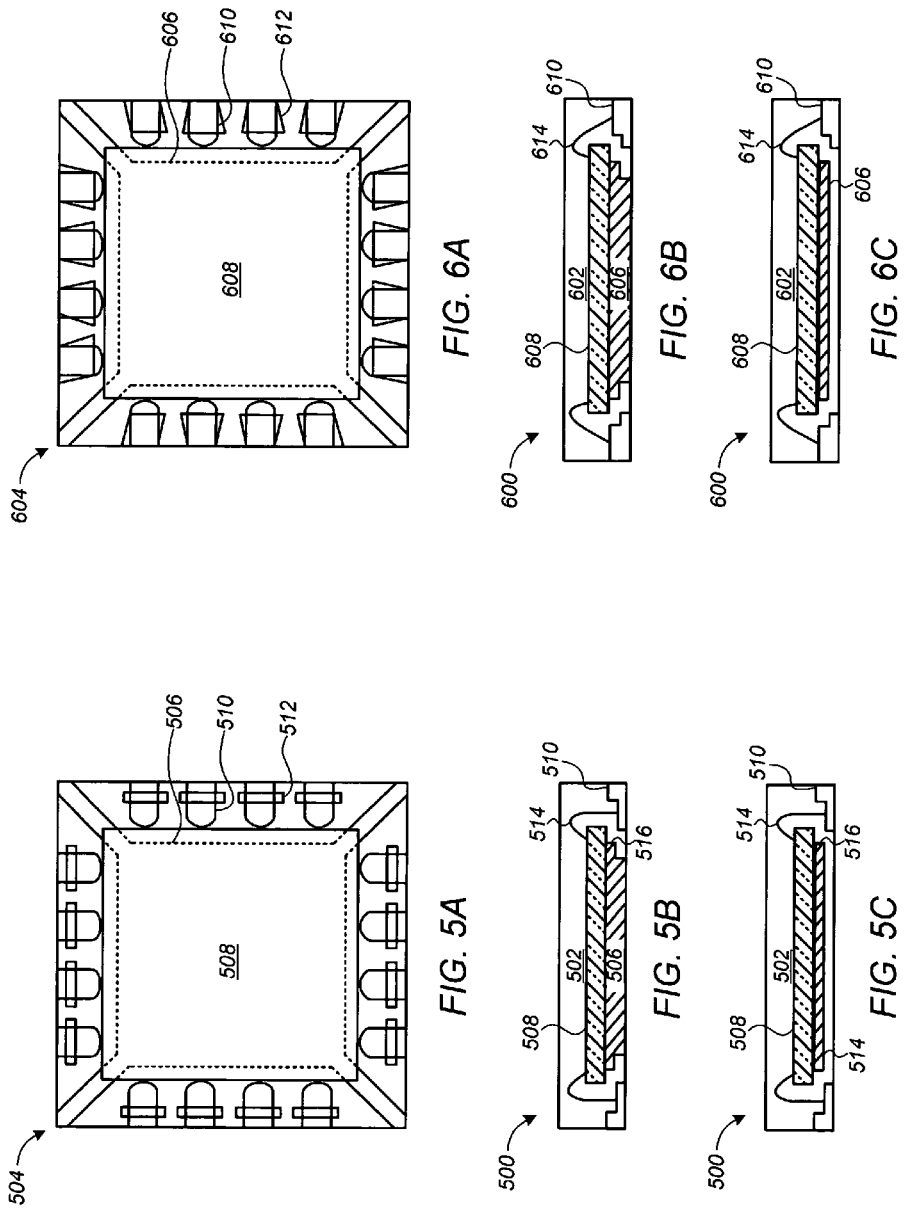

INTEGRATED CIRCUIT PACKAGE AND PACKAGING METHOD

CROSS-REFERENCE TO RELATED APPLICATIONS

The present application claims the benefit of priority under 35 U.S.C. 119(e) to U.S. Provisional Patent Application Ser. No. 60/931,889 entitled "Method Of Lead Construction To Maximize Chip Size In Package," filed May 25, 2007, which application is hereby incorporated by reference in its entirety.

TECHNICAL FIELD

This invention pertains generally to fabrication of semiconductor devices, and more particularly to methods and structures for packaging devices that addresses maximum chip size constraints, thereby enabling smaller packages.

BACKGROUND OF THE INVENTION

Semiconductor devices such as integrated circuits (ICs) are fabricated in or on a surface of a semiconductor substrate or wafer that is subsequently divided or diced into a number of discrete chips or dies each having a device or IC formed thereon. One or more dies are then enclosed in a package that provides physical and electrical protection of the die(s) while electrically connecting it with external circuits, devices and power supplies. Packages for semiconductor devices are available in the very wide variety of designs depending on the desired electrical connections out of the package, desired heat dissipation or thermal conductivity, and other physical requirements, such as optical transparency.

Conventional molded packages, such as that shown in FIGS. 1A and 1B are produced by attaching the die or chip 100 to a flag or paddle 102 of a leadframe 104, and electrically coupling circuit elements on the chip to lead fingers or leads 106 using a bonding wire 108. Typically, the leadframe 104 with the attached chip 100 is then encapsulated in a plastic molding compound to form a package body or package 110 using an injection or transfer molding process.

One problem with the conventional packaging technology shown in FIGS. 1A and 1B, known as epoxy chip bonding, is that the maximum allowable size or dimension (D) of the chip 100 in the package 110 is equal to or smaller than the size of the paddle 104 (P). In particular, referring to FIG. 1A it is seen that the maximum allowable dimension of the chip 100 within the package 110 is limited as expressed by the following equation:

$$D=B-2(L+b+a) \quad \text{(Eq. 1)}$$

where D is the maximum allowable chip dimension, B is a size or dimension of the package 110, L is a length of the leads 106 inside the package body, b is a spacing or separation between the leads and the paddle 102, and a is a distance from an edge of the chip to an edge of the paddle.

For certain advanced packaging technologies (not shown) the chip 100 can be very precisely centered on the paddle 102, thereby enabling the chip to paddle edge distance or spacing (denoted by a in FIG. 1A) to be eliminated, and facilitating the packaging of slightly larger chips as express by equation no. 2:

$$D=B-2(L+b) \quad \text{(Eq. 2)}$$

It will be appreciated that even with these advanced technologies the conventional packages and packaging method impose severe constraints on the maximum allowable chip dimensions, and/or on a minimum allowable package size.

Another conventional packaging method, shown in FIGS. 2A and 2B, intended to permit packaging of larger chip sizes uses a Chip-On-Lead (COL) technology. Referring to FIGS. 2A and 2B, the COL packaging method includes a step of laminating a backside or surface of a chip 200 with an electrically insulating material 202, such as a non-conductive adhesive, and attaching it directly to leads 204 of a leadframe 206 eliminating the need for a paddle in the leadframe altogether. Pads on the chip are then reverse wire bonded 208 to the leads 204, and the leadframe 206 with the chip mounted thereon encapsulated in a molding compound to form the package body 210. This approach does accommodate a larger chip size, however an assembly unit cost for devices or ICs packaged using COL technology is relatively higher than for the approach shown in FIGS. 1A and 1B due to the expense of an additional lamination step, and the cost of electrically insulating material 202 and capital equipment cost of tools for performing the lamination step.

Accordingly, there is a need for a package and packaging method for semiconductor devices and ICs that addresses maximum chip size constraints, thereby enabling packaging of larger chips and/or the use of smaller packages without substantially increasing the assembly unit cost for the packaged devices. It is further desirable that the package and packaging method are compatible with automated backend assembly or packaging process.

SUMMARY OF THE INVENTION

The present invention provides a solution to these and other problems, and offers further advantages over conventional packages and packaging methods.

In one aspect, the present invention is directed to a method of packaging a semiconductor device or integrated circuit (IC) fabricated on a chip or die. In one embodiment, the method includes steps of: (i) reducing a thickness of a portion of leads of a leadframe extending into a package being formed by machining or etching a portion of a top surface of the leads; (ii) mounting a die on which the device is fabricated to a die paddle of the leadframe, the die extending past an edge of the die paddle into an open space created by reducing the thickness of the leads; and (iii) encapsulating the leadframe and the die mounted thereon, including the portion of the leads having a reduced thickness in a molding compound. The step of reducing the thickness of a portion of the leads of the leadframe comprises the step of half-etching or machining a portion of the top surface of the leads prior to mounting the die thereon and encapsulating the leadframe. Optionally, the method can further include the step of etching a portion of a lower surface of the leads prior to encapsulating the leadframe to facilitate leadframe locking by the molding compound.

Generally, the method further includes the step of reverse wire bonding pads on the die to the package leads to form electrical connections therebetween. Preferably, the pads on die are reverse wire bond to etched portions of portions of the package leads. Alternatively, the wire bonding can be performed to electrically couple pads on the die to non-etched (full metal) portions of the package leads.

The method of the present invention is applicable to both saw-type and punch-type packages. Where the package in which the die is being packaged includes a saw-type package, the method further includes steps of sawing or cutting the molding compound and lead frames to separate a number of simultaneously molded packages into individual packages. Where the package is a punch-type package, the method further includes the step of separating lead frames of a number of co-joined individually molded packages using a punching method.

In another aspect, the present invention is directed to a package for a semiconductor device or die that enables packaging of larger dies and/or smaller package sizes. Generally, the package includes a molding compound encapsulating a leadframe having a number of leads and a die paddle or paddle on which the die is mounted. A thickness of a portion of the leads extending into the package is reduced by machining or etching a portion of a top surface thereof to create an open space into which the die extends past an edge of the die paddle. The reduced portion of the leads of the leadframe can have been reduced by half-etching or by machining a portion of the top surface of the leads.

Optionally, the thickness of a portion of the leads extending into the package is further reduced by machining or etching a portion of a lower surface thereof to facilitate lead locking by the molding compound.

Preferably, the package further includes wire bonding between pads on the die and etched portions of the package leads. Alternatively, the wire bonding can be between pads on the die and non-etched (full metal) portions of the package leads.

The package and packaging method of the present invention is applicable to both saw-type packages, in which the molding compound and lead frames are sawn or cut to separate a number of simultaneously molded packages into individual packages, and to punch-type packages in which a number of co-joined individually molded packages are separated using a punching method.

BRIEF DESCRIPTION OF THE DRAWINGS

These and various other features and advantages of the present invention will be apparent upon reading of the following detailed description in conjunction with the accompanying drawings and the appended claims provided below, where:

FIGS. 3A to 3C are schematic block diagrams illustrating a punch-type package having reduced leads to maximize a size of an IC in the package according an embodiment of the present invention;

FIGS. 4A to 4C are schematic block diagrams illustrating a punch-type package having according another embodiment of the present invention;

FIGS. 5A to 5C are schematic block diagrams illustrating a saw-type package having reduced leads to maximize a size of an IC in the package according an embodiment of the present invention;

FIGS. 6A to 6C are schematic block diagrams illustrating a saw-type package having according another embodiment of the present invention.

DETAILED DESCRIPTION

Figures 1A, 1B, 2A, 2B:
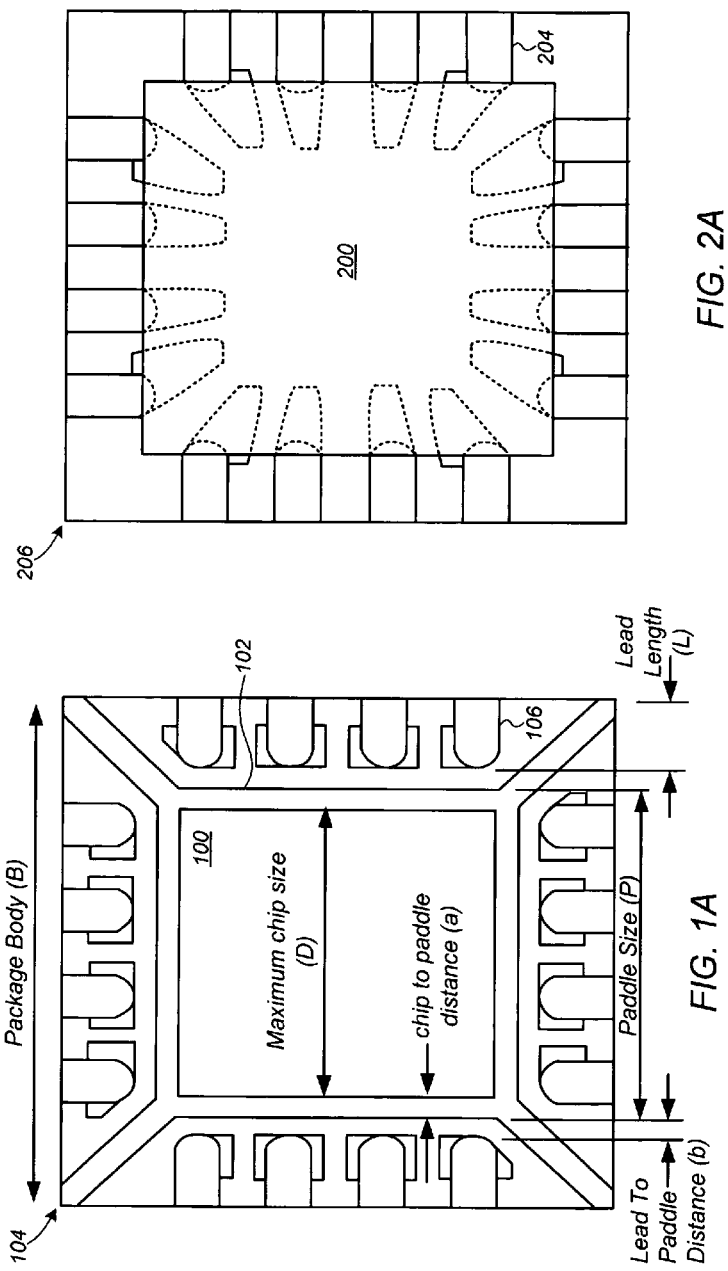
FIG. 1A is a schematic block diagram of a planar view of a leadframe used in a conventional integrated circuit (IC) package with a chip attached thereto.
FIG. 1B is a schematic block diagram of a cross-sectional side view of a conventional molded IC package including the leadframe of FIG. 1A.
FIG. 2A is a schematic block diagram of a planar view of a leadframe using a chip-on-lead (COL) construction.
FIG. 2B is a schematic block diagram of a cross-sectional side view of a conventional molded IC package including the leadframe of FIG. 2A.

The present invention is directed generally to methods and packages for packaging semiconductor devices and integrated circuits (ICs) that address maximum chip size constraints. In particular, the packaging structure or package and packaging method enables the packaging of larger IC chips or dies and/or the packaging of chips in smaller packages.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

Briefly, the present invention involves reducing or half-etching a portion of a top surface of leads inside a package in order to create an open space for the die or chip to extend outwards from the center of package. In one embodiment, a reverse wire bonding technique is used to form a connection between pads on the chip and etched areas of the package leads. Alternatively, the wire bonds extend to past the etched areas to attach or bond to the non-etched (full metal) areas of the package leads.

The method and packaging of the present invention is particularly useful in packaging ICs or semiconductor devices in miniature packages, such as Quad Flat-pack No-lead (QFNs) packages with package body sizes smaller than about 5 mm×5 mm. In certain preferred embodiments the method and packaging of the present invention enables QFNs packages with package body sizes smaller than about 4 mm×4 mm, and, more preferably with package body sizes smaller than about 3 mm×3 mm.

Packaging methods and packages or structures for packaging devices or ICs that addresses maximum chip size constraints, thereby enabling packaging of larger chips, or smaller package sizes will now be described in greater detail with reference to FIGS. 3A through 6C.

Broadly, all molded packages for ICs and semiconductor devices can be classified into saw-type packages or punch-type packages depending on the process used to singulate or divide co-joined manufactured packages. In particular, multiple saw-type packages are manufactured simultaneously by molding in a block of molding compound around a number of lead frames on which semiconductor dies have been mounted to form the package bodies for the die, followed by cutting or sawing the package body (molding compound) and lead frames to divide the co-joined manufactured packages into individual packages. The punch-type package is manufactured by individually molding in individual molds a number of co-joined lead frames on which semiconductor devices are mounted, followed by separating the lead frames using a punching method.

Punch-type packages and methods of forming the same according to one embodiment of the present invention will now be described in greater detail with reference to FIGS. 3A through 4C. Referring to FIGS. 3A and 3B, the package 300 generally includes a molding compound 302 encapsulating a metal leadframe 304 having a die paddle or paddle 306 to which a chip or die 308 on which the IC or device (not shown)

is fabricated is mounted, and a number of leads 310. Optionally or preferably, the leadframe 304 or leads 310 may further include interlocking features 312 extending perpendicularly from a long axis of the leads to aid in locking the leads in place in the molding compound 302 or the package 300. In yet another embodiment (not shown in these figures), the thickness of substantially the entire lead portion 310 of the leadframe 304 extending into the package 300 may be further reduced by machining or etching a lower surface portion thereof to further facilitate lead locking by the molding compound 302.

Note that in the planar view of the leadframe 304 shown in FIG. 3A, the paddle 306, which underlies the die 308, is shown using phantom or dashed lines. The die 308 can be affixed to the paddle 306 using any suitable adhesive or interposer material (not shown). Alternatively, the die 308 can be held in place on the paddle 306 prior to encapsulation with the molding compound 302 by a number of wire bonds 314 extending from pads (not shown) on the die and at least some of the number of leads 310 to form an electrical connections therebetween.

Referring to the cross-sectional side view of FIG. 3B, a thickness of a portion of the leads 310 extending into the package 300 or molding compound 302 is reduced to create an open space into which the die 308 extends past an edge 316 of the die paddle 306. This thinned or reduced portion of the leads 310 can be reduced by machining or etching a portion of a top surface of the leads prior to mounting the die 308 thereon and encapsulating the die and leadframe 304 in the molding compound 302. Preferably, the die 308 is sized and mounted to the paddle 306 so that it extends past the edge 316 of the paddle by a distance at least as great as a depth or width of an open space created by reducing the thickness of the leads 310. More preferably, the reduced portions of the leads 310 are reduced by etching a portion of the top surface of the leads to reduce a thickness of the metal by about half or 50%. However, it will be understood that this reduction of one half the metal thickness is exemplary only, and the thickness may be reduced by a greater or a lesser amount as desired.

Generally, where the leadframe 304 comprises a metal, for example, aluminum, copper, gold, nickel, cobalt, titanium, tungsten, or alloys thereof, the reduced portion of the leads 310 can be etched using a standard photolithographic masking processes and a wet etch.

As shown in FIG. 3B, the lower surface of the paddle 306 may extend through the molding compound 302 to be exposed on a lower surface of the package 300, for example, for thermal regulation or heat dissipation. Alternatively, as shown in FIG. 3C the entire die paddle 306 may be substantially enclosed or encapsulated by the molding compound 302. The embodiment of FIG. 3C can be useful when, for example, it is desirable to reduce or eliminate warpage stresses on the package 300 by providing substantially equal volumes of molding compound 302 above and below the leadframe 304.

In the embodiments shown in FIGS. 3B and 3C the wire bonds 314 extend from pads (not shown) on the die 308 to the thinned or reduced portion of the leads 310. The wire bonds 314 are formed using a reverse wire bonding technique in which a first ball is bonded to the etched portion of a lead 310 and second connection made to a pad or pads on the die 308.

Alternatively in another embodiment, shown in FIGS. 4A through 4C, wire bonds are formed between pads on the die and non-etched (full metal) portions of the leads using a standard wire bonding technique.

Referring to FIGS. 4A and 4B, the package 400 generally includes a molding compound 402 encapsulating a leadframe 404 including a paddle 406 on which die 408 is mounted, and a number of leads 410. Preferably, the leads 410 or leadframe 404 further include interlocking features 412 to aid in locking the leads in place in the molding compound 402. In the embodiment shown in FIG. 4A the interlocking features 412 are more robust than those shown in FIG. 3A, extending a greater distance along an axis of the leads 410.

Referring to the cross-sectional side views of FIGS. 4B and 4C, the leads 410 are electrically coupled to pads (not shown) on the die 408 by wire bonds 414 formed between the pads and the non-etched (full metal) portions of the leads. As noted above, the wire bonds 414 are formed using a standard wire bonding technique in which a first ball is bonded to a pad on the die 408 and the second connection made to the non-etched (full metal) of a lead 410. It will be appreciated that this embodiment may be preferred as having the advantage of being compatible with existing automated backend assembly or packaging processes and tools.

After multiple dies have each been mounted and wire bonded to a number of co-joined leadframes having the reduced or half-etched leads, the individual packages are simultaneously molded or enclosed within molding compound using individual molds, and then separated using a punching method that breaks or cuts the co-joined leadframes.

Saw-type packages can be formed according various embodiments of the present invention similar to those described above, and will now be described in detail with reference to FIGS. 5A through 6C.

Referring to FIG. 5A, a saw-type package 500 generally includes a molding compound 502 encapsulating a metal leadframe 504 having a die paddle or paddle 506 to which a chip or die 508 on which the IC or device (not shown) is fabricated is mounted, and a number of leads 510. Optionally or preferably, the leadframe 504 or leads 510 may further include interlocking features 512 extending perpendicularly from a long axis of the leads to aid in locking the leads in place in the molding compound 502 or the package 500. In addition, the thickness of the leads 510 extending into the package 500 may be further reduced by machining or etching a portion of their lower surface to further facilitate lead locking by the molding compound 502.

As described above, thickness of a portion of the leads 510 extending into the package 500 or molding compound 502 is reduced to create an open space into which the die 508 extends past an edge 516 of the die paddle 506. As also described above, the thinned or reduced portion of the leads 510 can be reduced by machining or etching a portion of a top surface prior to mounting the die 508 thereon and encapsulating the die and leadframe 510 in the molding compound 502.

The lower surface of the die paddle may be exposed on a lower surface of the package for thermal regulation or heat dissipation, as shown in FIGS. 5B and 6B, or substantially enclosed or encapsulated by the molding compound, as shown in 5C and 6C when, for example, it is desirable to reduce or eliminate warpage stresses on the package by providing substantially equal volumes of molding compound above and below the leadframe.

Referring to the cross-sectional side views of FIGS. 5B and 5C, the leads 510 are electrically coupled to pads (not shown) on the die 508 through wire bonds 514 to the thinned or reduced portion of the leads 510. As noted above, the wire bonds 514 are formed using a reverse wire bonding technique in which a first ball is bonded to the etched portion of a lead 510 and second connection made to a pad or pads on the die 508.

Referring to the cross-sectional side views of FIGS. 6B and 6C, in yet another embodiment the leads 610 are electrically coupled to pads (not shown) on the die 608 by wire bonds 614 formed between the pads and the non-etched (full metal) portions of the leads. As noted above, the wire bonds 614 are formed using a standard wire bonding technique in which a first ball is bonded to a pad on the die 608 and the second connection made to the non-etched (full metal) of a lead 610. It will be appreciated that this embodiment may be preferred as having the advantage of being compatible with existing automated backend assembly or packaging processes and tools.

After multiple dies have each been mounted and wire bonded to a number of co-joined leadframes having the reduced or half-etched leads the molding compound is simultaneously molded in a single, large or monolithic block around the leadframes on which dies are mounted. The individual packages are then formed by sawing or cutting the molding compound and lead frames into individual packages using a sawing process.

It will be appreciated by those skilled in the art that the above described packages and packaging method are compatible or adaptable to a wide range of package types including quad flat leaded packages (QFP) and quad flat no-lead packages (QFN), such as those having a ball-grid array (BGA). The method and packaging of the present invention is particularly useful in packaging ICs or semiconductor devices in miniature packages, such as QFNs packages with package body sizes smaller than about 5 mm×5 mm. In certain preferred embodiments the method and packaging of the present invention enables QFNs packages with package body sizes smaller than about 4 mm×4 mm, and, more preferably with package body sizes smaller than about 3 mm×3 mm.

The advantages of the method of the present invention over previous or conventional packages and packaging methods include: (i) increased maximum chip size for a given package size and/or smaller or finer package size for a given chip size is attainable through leadframe tooling change only; (ii) substantially no capital requirement to implement the process unlike with conventional Chip-On-Lead (COL) technology in which a wafer lamination machine is required in addition to a lamination film to set-up the process; (iii) the package and method is compatible with existing automated backend assembly and/or packaging process; and (iv) the package and packaging method are compatible with or adaptable to a wide range of package types.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A method of packaging a semiconductor device comprising steps of:
    forming a leadframe comprising leads, wherein each of the leads includes interlocking features extending from the lead perpendicularly to a long axis of the lead and parallel to a plane of the leadframe to lock the leads in place in a molding compound;
    reducing a thickness of a portion of the leads of the leadframe extending into a package being formed by etching a portion of a top surface of the leads;
    mounting a die on which the device is fabricated to a die paddle of the leadframe, the die extending past an edge of the die paddle into an open space created by reducing the thickness of the leads;
    wire bonding to form electrical connections between pads on the die and etched portions of the leads; and
    encapsulating the leadframe and the die mounted thereon, including the portion of the leads having a reduced thickness in the molding compound, wherein encapsulating the leadframe comprises providing substantially equal volumes of molding compound above and below the die paddle.

2. A method according to claim 1, wherein the step of reducing the thickness of a portion of the leads of the leadframe comprises the step of half-etching a portion of the top surface of the leads.

3. A method according to claim 1, further comprising the step of reducing at least a portion of a lower surface of the leads prior to encapsulating the leadframe and the die mounted thereon to facilitate lead locking by the molding compound.

4. A method according to claim 1, wherein the step of wire bonding comprises reverse wire bonding.

5. A method according to claim 1, wherein the package is a saw-type package, and wherein the method further comprises the step of sawing the molding compound and lead frames to separate into individual packages a number of simultaneously molded packages.

6. A package for a semiconductor device comprising:
    a molding compound encapsulating a leadframe having a die paddle on which a die on which the device is fabricated is mounted and a number of leads;
    wherein a thickness of a portion of the number of leads extending into the package is reduced by etching a portion of a top surface thereof to create an open space into which the die extends past an edge of the die paddle, and wherein each of the number of leads comprises interlocking features extending from the lead perpendicularly to a long axis of the lead and parallel to a plane of the leadframe to lock the leads in place in a molding compound; and
    wire bonds between pads on the die and etched portions of the number of leads,
    wherein volumes of molding compound above and below the die paddle are substantially equal to reduce warpage stresses on the package.

7. A package according to claim 6, wherein the reduced portion of the leads of the leadframe have been reduced by half-etching a portion of the top surface of the leads.

8. A package according to claim 6, wherein the thickness of a portion of the number of leads extending into the package is further reduced by etching a portion of a lower surface thereof to facilitate lead locking by the molding compound.

9. A package according to claim 6, wherein the package is a saw-type package.

10. A package according to claim 6, wherein the package is a punch-type package.

11. A package according to claim 6, wherein the package is a Quad Flat-pack No-lead (QFN) package.

12. A package according to claim 11, wherein the package has a body size smaller than about 5 mm×5 mm.

13. A method according to claim 1, further comprising reducing a thickness of the die paddle prior to mounting the die thereon.

14. A package for a semiconductor device comprising:
a molding compound encapsulating a leadframe having a die paddle on which a die on which the device is fabricated is mounted and a number of leads;
wherein a thickness of a portion of the number of leads extending into the package is reduced by etching a portion of a top surface thereof to create an open space into which the die extends past an edge of the die paddle; and
wherein each of the number of leads further comprise interlocking features extending from the lead perpendicularly to a long axis of the lead and parallel to a plane of the leadframe to lock the leads in place in the molding compound.

* * * * *